United States Patent [19]

Ogawa et al.

[11] 4,348,804
[45] Sep. 14, 1982

[54] METHOD OF FABRICATING AN INTEGRATED CIRCUIT DEVICE UTILIZING ELECTRON BEAM IRRADIATION AND SELECTIVE OXIDATION

[75] Inventors: Mitsuru Ogawa, Fuchu; Seiichi Iwamatsu, Hamuramachi, both of Japan

[73] Assignee: VLSI Technology Research Association, Kanagawa, Japan

[21] Appl. No.: 56,239

[22] Filed: Jul. 10, 1979

[30] Foreign Application Priority Data

Jul. 12, 1978 [JP] Japan ..................... 53-84030
Jul. 26, 1978 [JP] Japan ..................... 53-90496

[51] Int. Cl.³ .............. H01L 21/302; H01L 21/312
[52] U.S. Cl. .................................. 29/580; 29/578;
29/577 C; 29/591; 148/175; 156/643;
156/659.1; 156/904; 357/4; 357/49; 357/50;
357/59; 430/313; 430/314; 430/317; 430/942
[58] Field of Search .............. 29/578, 580, 577 C,
29/591; 148/175; 156/659.1, 904, 643; 430/942,
311-319; 357/4, 49, 50, 59

[56] References Cited

U.S. PATENT DOCUMENTS

| 3,484,662 | 12/1969 | Hagon | 148/175 X |
| 3,519,901 | 7/1970 | Bean et al. | 148/174 X |
| 3,859,716 | 1/1975 | Tihanyi | 29/578 X |
| 3,966,577 | 6/1976 | Hochberg | 156/643 |
| 4,063,901 | 12/1977 | Shiba | 29/578 |
| 4,092,442 | 5/1978 | Agnihotri | 430/317 |
| 4,109,029 | 8/1978 | Ozdemir et al. | 430/319 X |
| 4,131,910 | 12/1978 | Hartman et al. | 357/49 |
| 4,139,442 | 2/1979 | Bondur et al. | 156/643 X |
| 4,184,909 | 1/1980 | Chang et al. | 156/643 |
| 4,267,259 | 5/1981 | Bohlen et al. | 430/312 X |

FOREIGN PATENT DOCUMENTS 1160744 8/1969 United Kingdom ............. 148/175

Primary Examiner—L. Dewayne Rutledge
Assistant Examiner—W. G. Saba
Attorney, Agent, or Firm—Craig and Antonelli

[57] ABSTRACT

Dielectric isolation through electron beam irradiation is applied to a method of fabricating a semiconductor device. Upon forming an insulated gate field effect semiconductor device (FET) in a semiconductor layer on an insulation substrate, the insulated gate electrode is formed to extend over the semiconductor layer region around a semiconductor region in which FET is to be implemented. A semiconductor layer pattern underlying the extension of the gate electrode is enclosed by linear dielectric layers formed along the periphery of the electrode extension through electron beam irradiation. The pattern formation can be accomplished in a short time by virtue of arrangement such that the semiconductor layer pattern is enclosed by the linear dielectric layers. Electric coupling such as capacitive coupling between the gate electrode and other conductor layers is significantly reduced.

6 Claims, 40 Drawing Figures

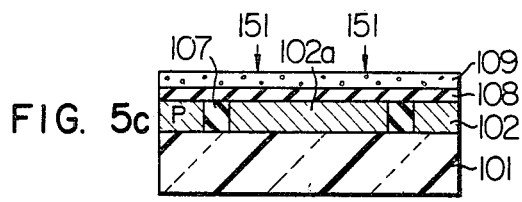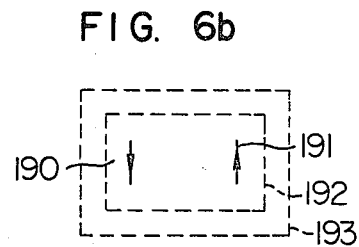

METHOD OF FABRICATING AN INTEGRATED CIRCUIT DEVICE UTILIZING ELECTRON BEAM IRRADIATION AND SELECTIVE OXIDATION

The present invention relates in general to semiconductor devices and in particular to large scale integrated circuits (hereinafter referred to as LSI in abridgment) having an ultra high integration density and suited to be implemented through an electron beam irradiation process and methods for fabricating such semiconductor devices.

In general, in the fabrication of a semiconductor device, a dielectric isolating method as represented typically by LOCOS process comprises forming a film of a non-oxidizable material such as silicon nitride ($Si_3N_4$) or the like in a desired pattern on a major surface of a semiconductor wafer through photo-etching technic or the like by using ultraviolet rays (having a wave length of about 400 $\mu$m) and selectively oxidizing the foundation semiconductor substrate through windows thus formed in the $Si_3N_4$ film. For the metalized wirings, the metalized film is subjected to a photo-etching process and air isolation is adopted for electrically insulating the wirings.

However, the dielectric isolation involving the oxidation of the surface of the semiconductor substrate is not suitable for applications where very high precision is required in the processing as is in the case of the fabrication of IC and LSI of a very high integration density for the reason that the width of dielectric layers which isolate circuit elements tends to be enlarged due to diffusion. When the air isolation is adopted as in the case of forming wirings from a metallic film, breakages in wiring are likely to occur at intersections between the wiring and isolating grooves in a multi-layer wiring structure. Such undesirable tendency becomes more remarkable in the applications where extremely fine and precise processing is required as in the case of ultra-large scale integrated circuits.

On the other hand, as an attempt to satisfy the demand for attaining a higher integration density in semiconductor integrated circuits, a resist exposure method using electron beam irradiation which is less susceptible to diffration and thus favorable for forming a fine pattern of grooves or apertures of width smaller than 1 $\mu$m has recently attracted interest in place of the conventional exposure method in which the etching is effected by means of ultraviolet rays through a mask of a photo-resist material.

An object of the invention is to provide a method of fabricating a semiconductor device having a high integration density by effecting selective impurity diffusion into a semiconductor layer and formation of electrode layers or wiring layers with the aid of an electron beam irradiation process.

Another object of the invention is to provide a semiconductor device which allows desired semiconductor patterns to be realized in a relatively short time by making use of an electron beam exposure or irradiation process.

Still another object of the invention is to provide a semiconductor device in which capacitive coupling as well as occurrence of failure such as short-circuit or the like are suppressed to a minimum.

According to an aspect of the invention, there is provided a method of fabricating a semiconductor device which comprises steps of forming an insulation film on a major surface of a first semiconductor layer, forming apertures in the insulation film by selectively removing the insulation film through electron beam irradiation, forming a second semiconductor layer on the insulation film, diffusing impurity contained in the second semiconductor layer into the first semiconductor layer through the apertures formed in the insulation film, and removing selectively the second semiconductor layer through electron beam irradiation thereby to provide electrode layers or wiring layers.

The present invention can be advantageously applied to implementation of an insulated gate field effect semiconductor device such as an insulated gate field effect transistor (hereinafter referred to as MOS FET or simply as FET) in a semiconductor layer formed on an insulation substrate such as SOS (silicon on sapphire). In this case, the insulated gate electrode is provided so as to extend over a semiconductor layer which encloses a semiconductor region destined to constitute a FET. The semiconductor layer region underlying the extension of the gate electrode is enclosed by linear dielectric layers extending along the periphery of the extension. Consequently, electric coupling such as capacitive coupling between the gate electrode and other conductor layer is decreased. Similar arrangement is adopted for the wiring structure.

The time required for forming an aperture pattern by means of electron beam is substantially proportional to the area to be irradiated by the electron beam. According to the invention, the electron beam is deflected in linear paths along the outline of a desired pattern thereby to allow the semiconductor pattern to be enclosed by the linear dielectric layers. Thus, the time required for forming the aperture pattern can be significantly reduced.

The foregoing objects and other objects as well as the characteristic features of the invention will become more apparent from the following description taken in conjunction with the accompanying drawings, in which.

Figure 3A:
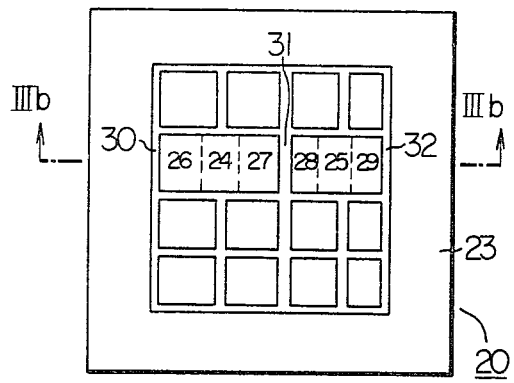
Figure 4A:
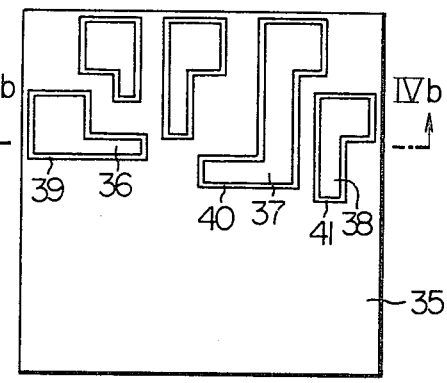
Figure 3B:
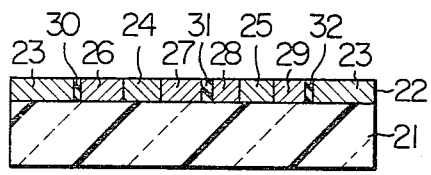
Figure 4B:
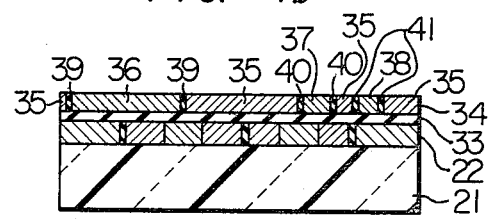
Figure 7:
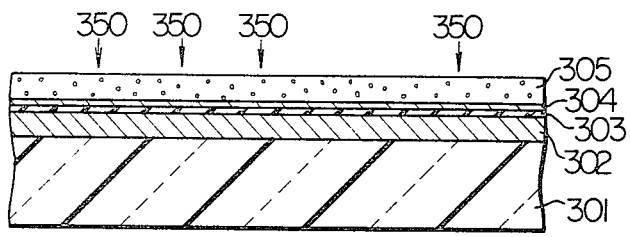
Figure 8A:
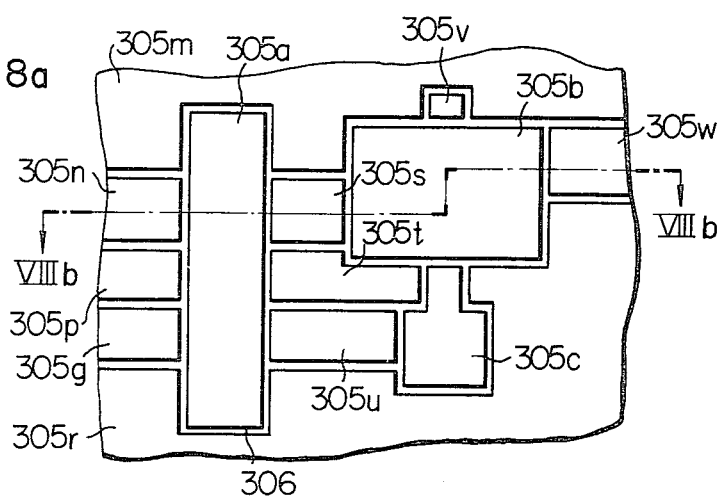
Figure 8B:
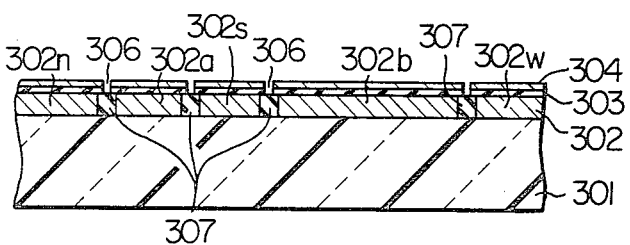
Figure 9:
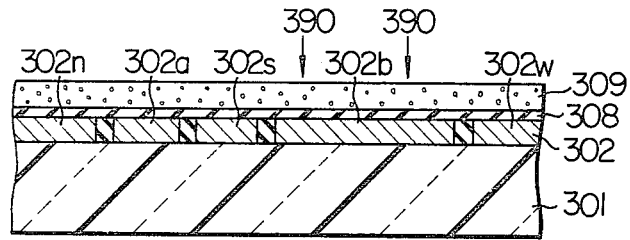
Figure 10A:
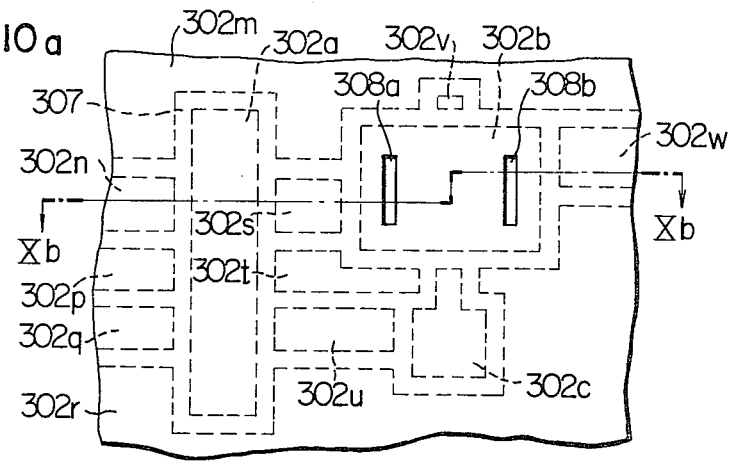
Figure 10B:
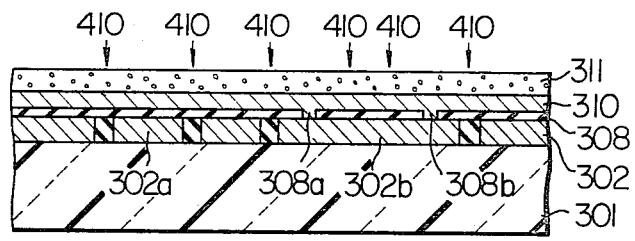
Figure 11A:
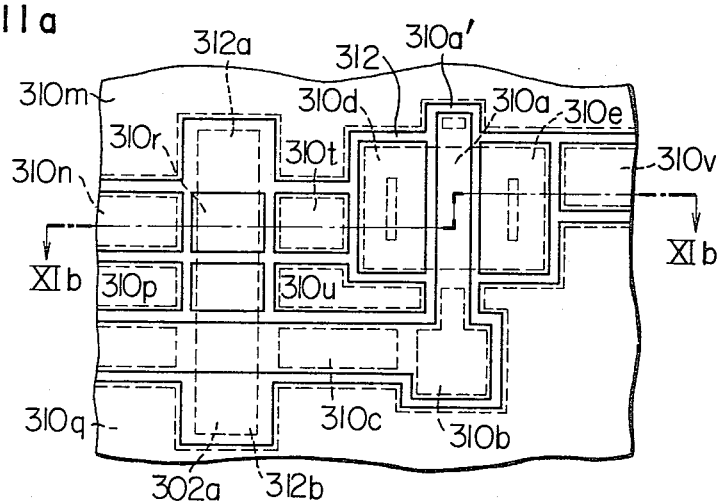
Figure 11B:
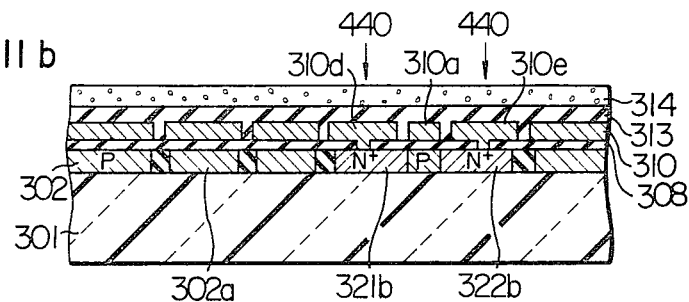
Figure 12A:
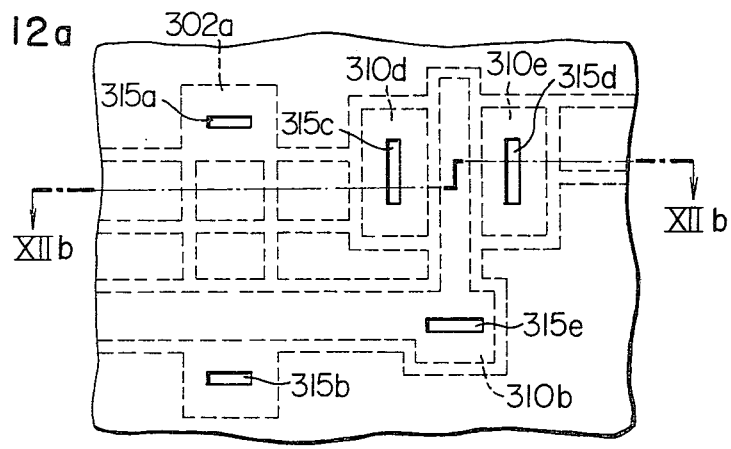
Figure 12B:
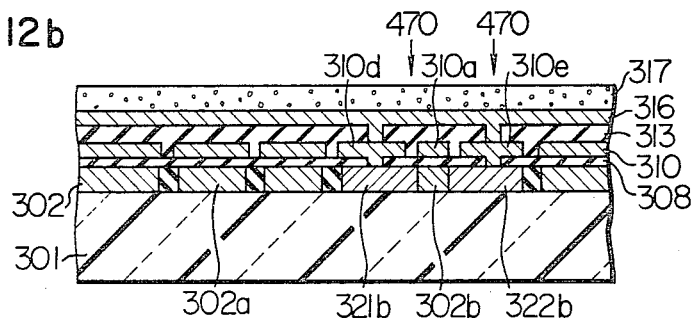
Figure 13A:
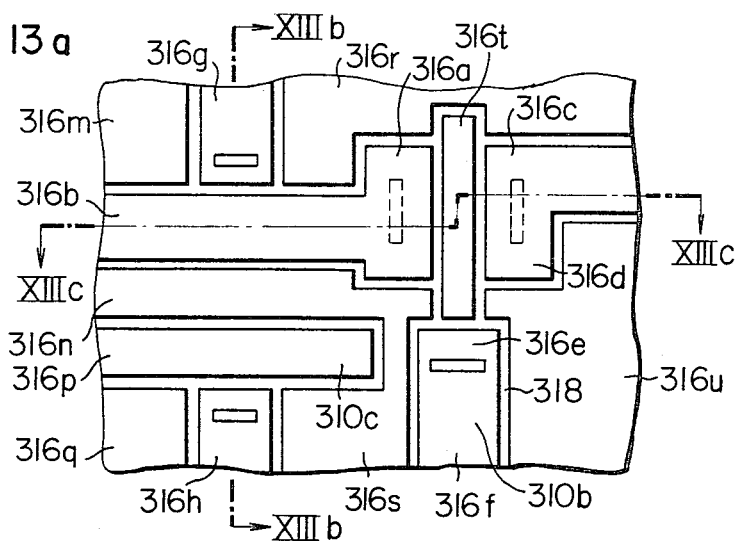
Figure 13B:
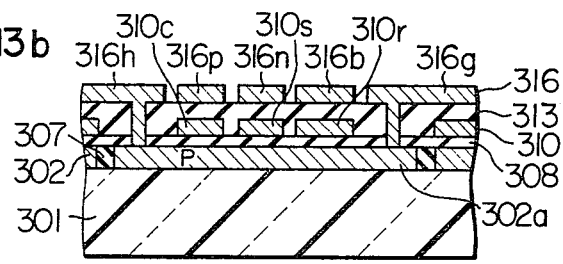
Figure 13C:
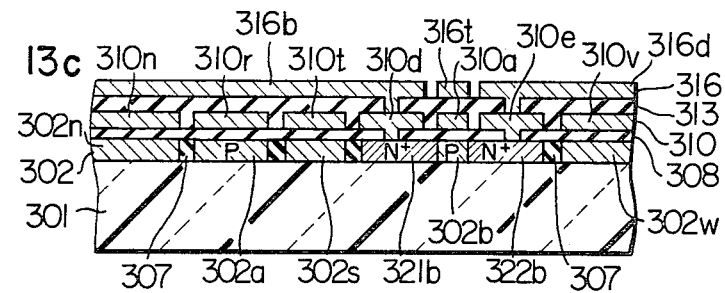

FIGS. 3a and 3b and FIGS. 4a and 4b illustrate still another example of the dielectric isolating method on the basis of which the present invention may be embodied, wherein FIGS. 3a and 4a show plan views and FIGS. 3b and 4b show sectional views;

FIGS. 5a to 5g show sectional views at various fabricating steps to illustrate a method of manufacturing a semiconductor device according to an exemplary embodiment of the invention;

FIGS. 6a to 6e show plan views to illustrate scanning by an electron beam employed in carrying out the method according to the above embodiment of the invention;

FIG. 7 to FIG. 13c show various fabricating steps for manufacturing semiconductor device according to other embodiment of the invention, in which FIG. 8a, FIG. 10a, FIG. 11a, FIG. 12a and FIG. 13a are plan views, and FIG. 8b, FIG. 10b, FIG. 11b, FIG. 12b, FIG. 13b and FIG. 13c are sectional views taken along VIIIb—VIIIb of FIG. 8a, Xb—Xb of FIG. 10a, XIb—XIb of FIG. 11a, XIIb—XIIb of FIG. 12a, XIIIb—XIIIb of FIG. 13a and XIIIc—XIIIc of FIG. 13c, respectively.

In the first place, examples of the dielectric isolating method which provides a basis for the present invention will be described with the aid of the drawings.

Figure 1A:
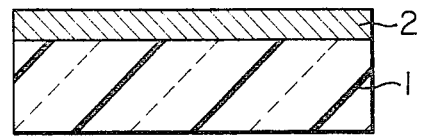
FIGS. 1a to 1f show sectional views of a main portion of a semiconductor structure at various fabricating steps to illustrate an example of a dielectric isolating method on the basis of which the invention may be embodied.
Figure 1B:
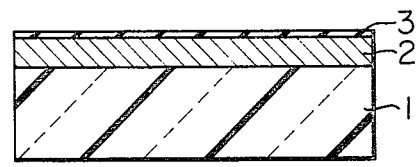
Figure 1C:
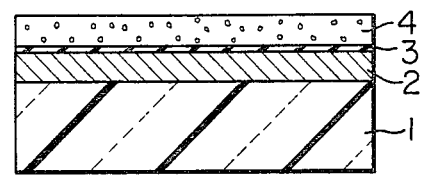
Figure 1D:
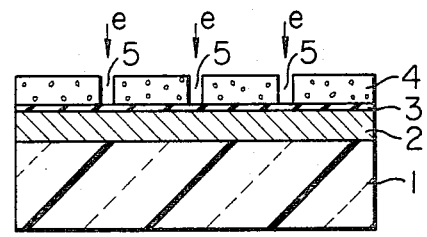
Figure 1E:
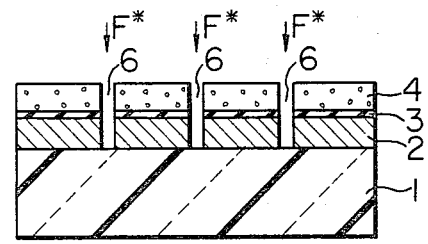
Figure 1F:
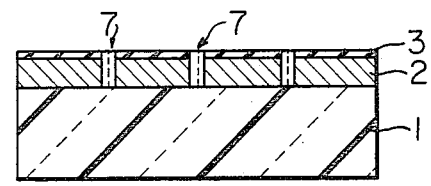

Referring to FIGS. 1a to 1f which illustrate a dielectric isolating method for a Si-film of a SOS (an abridgment of silicon on sapphire) structure as a typical example of the dielectric isolation of a semiconductor material, there is prepared a SOS wafer by depositing a single crystal silicon layer 2 on a substrate 1 of sapphire through an epitaxial growth, as is shown in FIG. 1a. Subsequently, a silicon nitride ($Si_3N_4$) film 3 is formed on the SOS wafer through a chemical vapor deposition process (hereinafter referred to CVD process) as is shown in FIG. 1b. Then, a photoresist film 4 is applied over the silicon nitride film 3 (FIG. 1c) and then selectively removed in a pattern of slit-like apertures or grooves each having a narrow width in the order of 0.1 $\mu$m through exposure to an electron beam thereby to form isolating regions 5 (FIG. 1d). Next, isolating regions 6 contiguous to the isolating regions 5 and having the same groove width as the latter are formed so as to extend through the $Si_3N_4$-film 3 and the single crystal silicon layer 2 to reach to the sapphire substrate through an anisotropic etching process or a reactive gas sputtering etching process by employing $CF_4$ gas, as is shown in FIG. 1e. Thereafter, the photo-resist film 4 is completely removed and then dielectric isolating layers 7 are formed through a thermal oxidation process until oxide films ($SiO_2$ film) formed on the opposite side walls of the individual isolating grooves 6 have been brought into contact with each other thereby to fill up the narrow grooves 6, as is illustrated in FIG. 1f. In this case, the oxide films progressively formed on the opposite side walls of the individual dielectric isolating grooves 6 can be fused together upon contacting thereof by lowering the softening point of the oxide film, which may be accomplished by diffusing phosphorus into the surface of the oxide film on the way of formation thereby to vitrify the oxide film into phosphor glass.

In the steps shown in FIG. 1f, the thermal oxidation for filing the grooves 6 with silicon oxide may alternatively be carried out after the removal of the silicon nitride film 3 which remains on the surface of the silicon layer 2 isolated in an island-like pattern. In this case a silicon oxide film may be formed on the upper surface of the silicon layer at the same time as filling the grooves with silicon oxide through the thermal oxidation process.

Figure 2A:
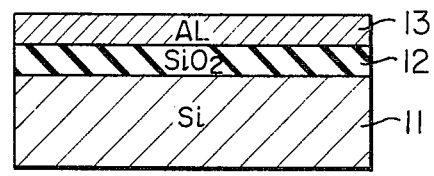
FIGS. 2a to 2e are sectional views of a main portion of a semiconductor structure at various fabricating steps to illustrate a wiring pattern forming process according to another dielectric isolating method on the basis of which the invention may be embodied.
Figure 2B:
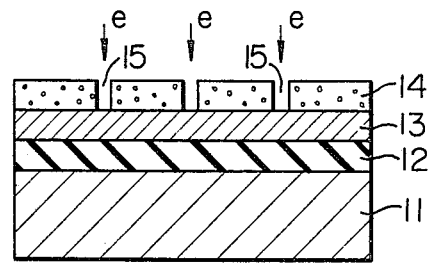
Figure 2C:
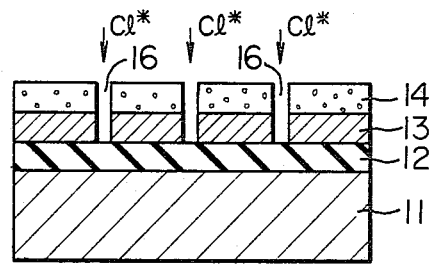
Figure 2D:
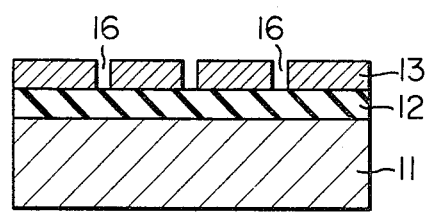
Figure 2E:
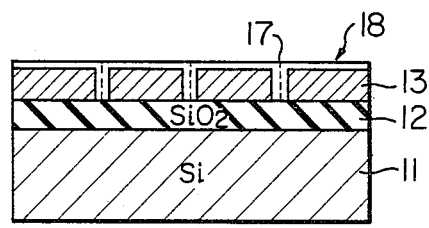

By way of another example, description will be made on the dielectric isolation effected on an aluminum (Al) wiring metallization film by referring to FIGS. 2a to 2e. For convenience sake of description, it is assumed that an Al-film is formed through evaporation on a silicon oxide film which in turn is formed on a silicon substrate and that Al wiring is realized through dielectric isolation. Referring to FIG. 2a, a silicon oxide film 12 is formed on a silicon region 11 and then an aluminium layer 13 is formed on the silicon oxide film 12 through a conventional evaporating process. Subsequently, a photo-resist film 14 is formed on the aluminium layer 13 as is shown in FIG. 2b and then selectively removed through exposure to an electron beam thereby to form open grooves 15 of a narrow or fine width on the order of 0.1 to 0.2 $\mu$m in which isolation regions are to be formed. Thereafter, those portions of the aluminium layer which are exposed through the open grooves 15 are removed through a reactive gas sputtering etching process by using a gas of chlorine series, thereby to form fine grooves 16 of about 0.1 to 0.2 $\mu$m in width which reach to the silicon oxide film 12 (FIG. 2). Thereafter, all the remaining photo-resist film 14 is removed. Finally, the exposed surface portions of the aluminium layer 13 are oxidized through a thermal oxidation treatment or the like thereby to fill the grooves 16 with aluminium oxide isolating layers 17 and form an overlying oxide layer 18 contiguously to the isolating layers 17. In this manner, metallization wiring isolated or separated from one another by dielectric isolations are formed.

EXAMPLE 1

Next, referring to FIGS. 3a and 3b together with FIGS. 4a and 4b, description will be made on an example of fabrication of a semiconductor integrated circuit device according to the invention which starts from a combination of the single crystal silicon patern forming technic described above with reference to FIGS. 1a to 1f and the metallic wiring pattern forming technic also described above with the aid of FIGS. 2a to 2f.

Referring to FIGS. 3a and 3b, fine grooves 30, 31, 32 and so forth which are filled with silicon oxide are formed in a P-conductivity type thin film 22 grown epitaxially on a sapphire substrate 21 through dielectric isolating method in combination with exposure to electron beam in a manner described hereinbefore by referring to FIGS. 1a to 1f, thereby to form a plurality of isolated island-like regions 23, 24 and 25. Subsequently, by making use of a silicon oxide film (not shown) formed on the island-like regions as a mask, selective diffusion of N-conductivity type impurity into the P-conductivity type region is carried out thereby to form N-conductivity type semiconductor regions 26, 27, 28 and 29 which constitute desired circuit element regions such as MOS type transistor regions. It will be noted that a P-conductivity type semiconductor region 23 is left as it is in a peripheral portion of the pellet 20 in which no circuit elements are to be implemented, as is shown in FIG. 3a, whereby a planar common surface which is flat as a whole is formed, as can be seen from FIG. 3b. Subsequently, a silicon oxide film 33 is formed over the flat surface with apertures for contacting electrodes being provided at desired locations, as is shown in FIGS. 4a and 4b.

A metallic film 34 such as aluminium or silicon is deposited over the silicon oxide film 33, which step is followed by a step of forming metalized wiring pattern regions 35, 36, and 38 separated or isolated from one another by a plurality of fine grooves 39, 40, 41 and so forth which are filled with a dielectric such as aluminium oxide or silicon oxide through the dielectric isolation process described hereinbefore in conjunction with FIGS. 2a to 2e. As can be seen from FIGS. 4a and 4b, when a given wiring region is considered, the whole periphery of the given region is enclosed by the fine isolating grooves with the metallic film remaining on the regions where no wiring is required, as the result of which a substantially planar common surface is obtained.

As will be appreciated from the foregoing description, since the circuit element isolating regions as well as the wiring isolating insulation region can be realized by forming linear grooves each having a width of 0.1 to 0.2 μm, the treatment by the electron beam can be carried out with a low repetition frequency such as a single or double scanning, which thus allows the time required for the treatment to be significantly reduced, while a higher precision can be attained in the product with failure such as short-circuit in the isolating grooves being suppressed to a minimum.

Further, because the metalization wiring pattern can be formed with a substantially flat surface, a multi-layer wiring structure having the isolating grooves intersecting one another can be formed in a satisfactory manner with failure such as breakage of the upper wiring layer being prevented.

EXAMPLE 2

In this example, the invention is applied to fabrication of a silicon gate type MOS semiconductor device of SOS-structure.

Figure 5A:
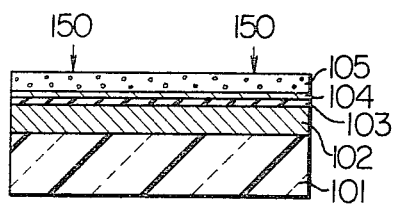

(1) Referring to FIG. 5a, a P-conductivity type silicon layer 102 of 0.3 μm in thickness is formed on a sapphire substrate 101 through vapor growth. A silicon dioxide ($SiO_2$) film 103 of 200 Å in thickness is formed over a major surface of the P-type silicon layer 102 and additionally a silicon nitride ($Si_3N_4$) film 104 of 500 Å in thickness is formed over the silicon dioxide film 102. By virtue of the structure such that the silicon dioxide film 103 is interposed between the N-conductivity type silicon layer 102 and the silicon nitride film 104, it is possible to prevent occurrence of failure in the P-type silicon layer 102 due to mechanical or structural stress upon cooling after thermal treatments described hereinafter.

A resist film 105 of a resist material having a high sensitivity to the electron beam irradiation and exhibiting a high resolving power such as polymethyl metacrylate (PMMA), for example, is deposited over the silicon nitride film 104.

Figure 6A:
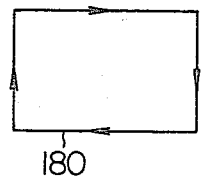

The resist material 105 is scanned and irradiated along a rectangular path 108 shown in FIG. 6a in the direction indicated by arrows by an electron beam 105 produced from an electron gun of a scanning type electron microscope or SEM type and having a focussed beam diameter of 0.1 to 0.3 μm. Through exposure to the electron beam, a pattern of groove of an extremely small width (hereinafter referred to as the fine groove pattern) is formed in the resist film 105 in correspondence to the rectangular scanning path 180.

Next, the silicon nitride film 104 is selectively removed through etching by using the resist film 105 as a mask thereby to form a fine groove pattern in the silicon nitride film 104 in correspondence to the rectangular path 108. Further, by using the silicon nitride film 104 having the fine groove pattern formed therein as a mask, the silicon dioxide film 103 is selectively removed through etching thereby to form the fine groove pattern corresponding to the rectangular path 180 also in the silicon dioxide film 103.

Figure 5B:
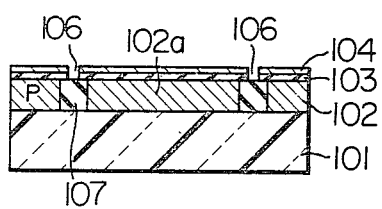

(2) Referring to FIG. 5b, the N-conductivity type silicon layer 102 is selectively oxidized through the fine groove pattern 106 formed in the silicon nitride film 104 and the silicon dioxide film 103 in correspondence to the rectangular path 80, thereby to form an oxide insulation or isolation layer 107 which extends from the surface of the P-conductivity type silicon layer 102 to the major surface of the substrate 101 and serves to insulate or isolate the island-like region 102a defined therein from other P-conductivity type silicon layer 2. The formation of the oxide insulation or isolation layer 107 may be carried out through a thermal oxidizing treatment in the atmosphere containing oxygen or steam at a temperature in the range of 900° to 1250° C.

(3) Referring to FIG. 5c, after the complete removal of the silicon nitride film 104 and the silicon dioxide film 103 from the P-conductivity type silicon layer 102, a silicon dioxide film 108 of 200 Å in thickness is again formed through oxidizing treatment in the atmosphere of dry oxygen gas at temperature of 800° C. and subsequently coated with a resist material 109 such as PMMA or the like which is then scanned by an electron beam 51 produced from SEM and having a focussed diameter of 0.1 to 0.3 μm along linear paths 190 and 191, as is shown in FIG. 6d. In this figure, broken lines 192 and 193 designate inner and outer peripheries of the oxide insulation layer 107. Through the exposure to the electron beam, a fine groove pattern corresponding to the linear scanning paths 190 and 191 is formed in the resist material coat 109.

(4) Next, referring to FIG. 5d, the resist material coat 109 having the fine groove pattern formed therein is used as a mask to selectively remove the silicon dioxide film 108 through etching, whereby a fine groove pattern 110 corresponding to the linear scanning phases 190 and 191 is formed also in the silicon dioxide film 8.

A polycrystalline silicon layer 112 of 2000 Å in thickness is formed on the silicon dioxide film 108. Formation of the polycrystalline silicon layer may be realized by reducing, for example, silicon tetra-chloride ($SiCl_4$) in the hydrogen containing atmosphere at a temperature in the range of 700° C. to 1000° C. The upper surface of the polycrystalline silicon layer 112 is coated with a resist material 113 such as PMMA or the like which is then scanned by an electron beam 152 produced from SEM and having a focussed beam diameter of 0.1 to 0.3 μm along linear scanning paths 200, 201, 202, 203, 204, 205, 206, 207, 208 and 209 shown in FIG. 6c. In this figure, broken lines 250 and 251 denote the fine groove patterns 10 and 11, respectively, formed in the silicon dioxide film 108. Through the exposure to the electron beam radiation, a fine groove pattern corresponding to the scanning paths 200 to 209 is formed in the resist material coat 113.

(5) Referring to FIG. 5e, the resist material coat 113 having the fine groove pattern formed therein is used as a mask to selectively remove the polycrystalline silicon layer 112 through etching, whereby a fine groove pattern 114 corresponding to the linear paths 200 to 209 is formed in the polycrystalline silicon layer 112. The fine groove pattern 114 formed in the polycrystalline silicon layer 112 corresponds to the region defined among broken line rectangles 210, 211, 214 and 213 shown in FIG. 6e. Thus the polycrystalline silicon layers 112s, 112g and 112d destined to serve for a source electrode, a gate electrode and a drain electrode, respectively, are electrically isolated from one another.

After the removal of the resist material 113, an N-type impurity such as phosphorus (P), for example, is diffused into the polycrystalline silicon layers 112, 112s, 112g and 112d with a high concentration of $10^{21}/cm^3$ at a temperature in the range of 900° C. to 1300° C. Further, the $N^{30}$-type impurity contained in the polycrystalline silicon layers 112s and 112d is selectively diffused into the isolating island region 102a of P-conductivity type silicon layer through the fine groove patterns 110 and 111 formed in the silicon dioxide film 108, thereby to form an $N^{30}$-type source region 113 and a $N^+$-type drain region 114, respectively. As the result of the impurity diffusion with high concentration, the resistivity of the polycrystalline silicon layers 112, 112s, 112g and 112d can be sufficiently decreased to be used as the source electrode, gate electrode and the drain electrode, respectively. In this way, a silicon gate type MOS field effect transistor has been complemented.

The polycrystalline silicon layers 112, 112s, 112g and 112d are coated with a silicon dioxide film 115 of 2000 Å in thickness through CVD method (chemical vapor deposition method). Subsequently, a resist material 116 such as PMMA, for example, is coated and scanned by scanning an electron beam 153 produced from SEM and having a focussed beam diameter of 0.1 to 0.3 μm along linear paths 213, 214 and 215 shown in FIG. 6d. Through the exposure to the electron beam radiation, a fine groove pattern corresponding to the straight lines 213, 214 and 215 is formed in the resist material layer 116.

(6) Next referring to FIG. 5e, the resist material coat 116 having the fine groove pattern formed therein is used as a mask to remove selectively the silicon dioxide film 115 through etching, whereby a fine groove pattern 117 corresponding to the lines 213, 214 and 215 is formed in the silicon dioxide film 115. The profile of the fine groove pattern 117 is represented by broken lines 220, 221 and 222 in FIG. 6e.

Thereafter, an aluminium layer 118 of 5000 Å in thickness is formed on the silicon dioxide film 115 through a vacuum evaporation or the like process and additionally a resist material layer 119 such as PMMA or the like is deposited thereon. The resist layer 119 is scanned by an electron beam 154 produced from SEM and having a focussed beam diameter of 0.1 to 0.3 μm along straight lines 223 to 229 shown in FIG. 6e, which results in the formation of a fine groove pattern in the resist layer 119 corresponding to the lines 223 to 229.

(7) Subsequently, the resist material 119 having the fine groove pattern formed therein is used as a mask to selectively remove the aluminium layer 118 through etching, thereby to form a fine groove pattern 120 corresponding to the lines 223 to 229 in the aluminium layer 118. The fine groove pattern thus formed serves to electrically isolate or insulate a source wiring aluminium layer 118s, a gate wiring aluminium layer 118g and a drain wiring aluminium layer 118d from one another.

In summary, in the case of the example described above, the fine groove patterns are formed in the silicon nitride film and the silicon dioxide film through linear scannings of the electron beam having a focussed beam diameter of 0.1 to 0.3 μm thereby to selectively oxidize the silicon layer, which step is followed by formation of the fine groove pattern in the silicon dioxide film through a similar scanning by the electron beam thereby to selectively diffuse impurity into the polycrystalline silicon layer formed on the silicon dioxide film through the fine groove pattern, and again the fine groove pattern is formed in the polycrystalline silicon layer and the aluminium layer formed thereon with the interposition of the silicon dioxide film through the similar scanning by the electron beam thereby to allow the fine electrons and fine wirings to be formed in these layers.

Many modifications may be adopted in the example described above.

For example, when the P-type silicon layer of the isolating island-like region 102a defining therein the silicon gate type MOS field effect transistor region is to be grounded, a fine groove pattern may be formed in the silicon dioxide film overlying the P-type silicon layer through exposure to a similar electrode beam scanning, thereby to form a polycrystalline silicon layer for the grounding electrode adapted to be ohmic contacted to the above P-type silicon layer through the fine groove pattern. The polycrystalline silicon layer serving for the grounding electrode is then connected to the ground potential through an aluminium wiring layer in the manner described above.

When the distance between the two fine groove patterns 110 and 111 formed in the silicon dioxide film shown in FIG. 5d is selected sufficiently small so that the $N^+$-silicon layers 113 and 115 shown in FIG. 5e may contact with each other through lateral impurity diffusion occurring upon the impurity diffusion from the polycrystalline silicon layers 112s and 112d, the element structure as shown in FIG. 5g can be converted into a crossover wiring structure in which the wiring layers 118s, 118d and 118g are cubically crossed by the $N^-$-type silicon layers 113 and 114 which are electrically connected to each other.

EXAMPLE 3

In the case of this example, the invention is applied to a fabrication of a silicon gate type MOS semiconductor device of SOS structure.

As can be seen from a sectional view shown in FIG. 7, a P-conductivity type silicon layer 302 of 0.3 μm in thickness is formed on a sapphire substrate 301 through vapor growth. A silicon dioxide ($SiO_2$) film 303 of 200 Å in thickness is formed on the major surface of the P-type silicon layer 302 and further a silicon nitride ($Si_3N_4$) film 304 of 500 Å in thickness is formed on the upper surface of the silicon dioxide film 303. By virtue of the structure such that the silicon dioxide film 303 is interposed between the N-type silicon layer 302 and the silicon nitride film 304, it is possible to prevent occurrence of failure in the P-type silicon layer 302 due to mechanical or structural stress induced upon cooling after the thermal treatment described hereinafter.

A resist material 305 having a high sensitivity to electron beam irradiation and exhibiting a high resolving power such as PMMA (polymethyl metacrylate), for example, is applied over the silicon nitride film 304.

The resist material coat 305 is scanned and irradiated by an electron beam 305 so as to depict a linear pattern along a desired profile. The electron beam may be produced from SEM (scanning type electron microscope) and have a focussed beam diameter of 0.1 to 0.3 82 m. The resist material 305 is of positive type. Accordingly, through the exposure to the electron beam and the subsequent development, a fine groove pattern including linear grooves of an extremely small width is formed in the resist material 305, as is shown in a plan view of FIG. 8a.

Next, the silicon nitride film 304 is selectively removed through etching by using the resist coat 305 as a mask thereby to form a fine groove pattern in the silicon nitride film 304 in correspondence to the fine groove pattern of the resist mask. Further, by using the silicon nitride film 304 having the fine groove pattern formed therein as a mask, the silicon dioxide film 303 is selectively removed through etching thereby to form the fine groove pattern corresponding to the above pattern also in the silicon dioxide film 303.

Referring to FIG. 8b, the N-conductivity type silicon layer 302 is selectively oxidized through the fine groove pattern 306 formed in the silicon nitride film 304 and the silicon dioxide film 303, thereby to form an oxide insulation or isolation layer 307 which extends from the surface of the P-conductivity type silicon layer 302 to the major surface of the sapphire substrate 301. The formation of the oxide insulation or isolation layer 307 may be carried out through a thermal oxidizing treatment in the atmosphere containing oxygen or steam at a temperature in the range of 900° to 1250° C. Alternatively, the oxide insulation layer may be formed by the method described hereinbefore in conjunction with the Example 1.

The oxide insulation layer 307 thus formed divides the P-type silicon layer 302 into island-like regions 302a to 302c and 302m to 302w as is shown in FIG. 10a. The island-like region 302a is destined to be used for the wiring, while the island-like region 302b constitutes a semiconductor region of MOS FET (field effect transistor). Further the island 302c is used for the disposition of an extension of the gate electrode. The other island-like regions 302m to 302w are left as they are during the subsequent processes with a view to flattening the foundation surface on which various films are formed subsequently.

Referring to FIG. 9, after the complete removal of the silicon nitride film 304 and the silicon dioxide film 303 from the P-conductivity type silicon layer 302, a silicon dioxide film 308 of 200 Å in thickness is again formed through oxidizing treatment in the atmosphere of dry oxygen gas at a temperature of 800° C. and subsequently coated with a resist material 309 such as PMMA or the like.

Subsequently, in order to provide a fine groove pattern in the silicon dioxide film 308 for diffusing impurity into the first semiconductor layer, the resist coat 309 is scanned and irradiated by an electron beam 309 produced from SEM and having a beam diameter of 0.1 to 0.3 $\mu$m. Through development, the fine groove pattern is formed in the resist material coat.

Next, referring to FIG. 10a, the resist material coat 309 having the fine groove pattern formed therein is used as a mask to selectively remove the silicon dioxide film 308 through etching, whereby fine groove patterns 308a and 308b for impurity diffusion are formed in the silicon dioxide film 308.

A polycrystalline silicon layer 310 of 2000 Å in thickness is formed on the silicon dioxide film 308, as is shown in FIG. 10b. Formation of the polycrystalline silicon layer may be realized by reducing, for example, silicon tetra-chloride (SiCl$_4$) in the hydrogen containing atmosphere at a temperature in the range of 700° to 1000° C. The upper surface of the polycrystalline silicon layer 310 is coated with a resist material 311 such as PMMA or the like which is then scanned by an electron beam 310 produced from SEM and having a focussed beam diameter of 0.1 to 0.3 $\mu$m. At this time, the resist material 311 is exposed to the electron beam irradiation not only in a linear pattern but also in a planar form, as will be described hereinafter in combination with FIG. 11a. The irradiation in the planar form may be accomplished by repeating the scanning by the electron beam at a small pitch, for example. The resist material 311 is developed, whereby the regions irradiated by the electron beam are removed.

Subsequently, the polycrystalline silicon layer 310 is selectively etched by using the resist material coat 311 as the etching mask. The polycrystalline silicon layer 310 is divided into a plurality of zones or regions 310a to 310v by the groove 312 formed through the selective etching.

Next, referring to FIG. 11b, after the resist material 311 having been removed, N-type impurity such as phosphorus (P), for example, is diffused into the polycrystalline silicon layer 310 with high concentration of $10^{21}$/cm$^3$ at a temperature in the range of 900° to 1300° C. Subsequently, the N-type impurity contained in the polycrystalline silicon layer 310 is selectively diffused into the P-conductivity type silicon layer 302b through the grooves 308a and 308b formed in the silicon dioxide film 308 (refer to FIG. 10a), therey to form a N$^+$-type drain region 321b and a N$^+$-type source region 322b, respectively.

As the result of the impurity diffusion with high concentration the resistivity of the polycrystalline silicon layer 310 can be suffficiently decreased. The polycrystalline silicon layers 310d, 310a and 310e are used as the drain electrode, gate electrode and the source electrode, respectively, of the silicon gate type FET. Referring to FIG. 12a, the polycrystalline silicon layer 310 is used as a lead for the gate electrode, while the layer 310c is used for wiring.

These polycrystalline silicon layers 310 are coated with a silicon dioxide film 313 of 2000 Å in thickness through CVD method (chemical vapor deposition method). Subsequently, a resist material 314 such as PMMA, for example, is coated.

In order to provide a mask for forming fine grooves 315a to 315f in the silicon dioxide film 308 such as shown in FIG. 12a, the resist material 314 is linearly scanned by an electron beam 440 produced from SEM and having a focussed beam diameter of 0.1 to 0.3 $\mu$m. Thereafter, the resist material 440 is developed.

Subsequently, the silicon dioxide film is selectively etched by using the resist material 314 as a mask, as is shown in FIG. 12a, as the result of which the silicon dioxide films 313 and 308 are selectively removed through the grooves 315a and 315b, whereby the P-type silicon layer 302a is exposed. The silicon dioxide film 313 is removed at the grooves 315c to 315e, whereby the polycrystalline silicon layers 310d, 310e and 310b are exposed at locations corresponding to these grooves.

After the removal of the resist material 314, an aluminium layer 316 of 5000 Å in thickness if formed on the silicon dioxide film 315 through a vacuum evaporation or the like process and additionally a resist material layer 317 such as PMMA or the like is deposited thereon, as is shown in FIG. 12b.

Next, in order to divide the aluminium layer 316 by the fine groove pattern 318 in a manner shown in FIG. 13, the resist layer 317 is scanned by an electron beam 470 produced from SEM and having a focussed beam diameter of 0.1 to 0.3 $\mu$m, and then developed.

Subsequently, the resist material 314 is used as a mask to selectively remove the aluminium layer 316 through etching, as the result of which, the aluminium layer 316 is divided into zones or regions 316a to 316u as is shown in FIG. 13a. In this case, these divided aluminium zones 316a to 316b may be isolated from each other by air or alternatively by the filled dielectric as described hereinbefore.

Next, resist material 317 is removed.

As can be seen from FIG. 13a and FIGS. 13b and 13c which show sections taken along the lines XIIIb—XIIIb and XIIIc—XIIIc in FIG. 13a, in the case of the present example, the polycrystalline silicon layer 310d for the drain electrode is connected to the aluminium wiring layers 316a and 316b through 315c, while the polycrystalline silicon layer 310e for the source electrode is connected to the wiring aluminium layers 316c and 316d through 315d. The polycrystalline silicon gate electrode 310a extends contiguously to the extension 310b and the P-type silicon layer 302c (refer to FIG. 10a) and is connected to the aluminium wiring layer 316f through 315e at the extension 310b. The extension 310b is contiguous to the polycrystalline silicon wiring layer 310c (refer to FIG. 11a).

The aluminium wiring layers 316g and 316h are connected to the P-type silicon layer 302 through 315a and 315b.

In the semiconductor device of the structure described above, any failure can be prevented by virtue of the arrangement such that the P-type silicon layer 302c is electrically isolated from the other P-type layers by the oxide insulation layer 307, even when undesirable pin holes are formed in the silicon dioxide film 308 overlying the P-type silicon layer 302c having a relatively large area or when the P-type silicon layer 302c is short-circuited to the polycrystalline silicon layer 310b due to dielectric breakdown.

The polycrystalline silicon layer 310b and the P-type silicon layer 302c described above are capacitively coupled to each other through thin silicon dioxide film 308 to a relatively high degree. However, since the P-type silicon layer 302c per se is isolated from the other P-type silicon layers by the oxide insulation layer 307 in a satisfactory manner, undesirable electric coupling can be effectively prevented from occurring between the polycrystalline silicon layer 310b destined to be applied with signals and the other P-type silicon layers as compared with the structure in which the P-type silicon layer 302c is not isolated from the other P-type silicon layer.

For the same reason as described above, the P-type silicon layer region underlying the polycrystalline silicon layer 310c is also electrically isolated from the other P-type silicon layer regions by the oxide insulation layer 307.

As can be seen clearly from FIG. 11a, the polycrystalline silicon layer 310s overlying the P-type silicon layer 302a is electrically isolated from the other polycrystalline silicon layers 310f and 310u by the grooves. Consequently, even when the P-type silicon layer 302a and the polycrystalline silicon layer 310s are capacitively coupled to each other to a high degree through the thin silicon dioxide film 308, undesirable coupling between the P-type silicon layer 302a and the other polycrystalline silicon layers 310p, 310u and so forth can be positively prevented.

For the similar reason, the P-type silicon layers 302n and 302s underlying the aluminium wiring layer 316b for the drain electrode as well as the polycrystalline silicon layers 310n and 310t are electrically isolated from the other counterpart layers.

The gate electrode 310a of MOS FET extends to and over the P-type silicon layer 302v enclosed by the oxide insulation layer 307. With such arrangement, any error in the fabricating precision will not involve retraction of end portion 310a' of the gate electrode 310a to and over the P-type silicon layer 302b (refer to FIG. 11a). Thus, MOS FET manufactured according to the invention can exhibit excellent performances independently from variable factors in the fabricating conditions.

The structure in which the conductive layers which are not destined to be used as signal lines and lie over and below the conductive layers constituting the signal lines are electrically isolated as described above is very effective for preventing undesirable electrical coupling and failure in the circuit operation.

In the case of the present example, all the zones or regions except for those of P-type silicon layer 302 destined for the semiconductor region of MOS FET and zones destined for the wirings may be replaced by oxide insulation layers. However, in this case, the resist material has to be exposed in a planar pattern in place of the linear pattern described hereinbefore. When the electron beam is employed for the exposure source, the planar exposure is realized by a set of linear scanning irradiations. Accordingly, there arises a disadvantege that a relatively long time is required for the exposure of the resist material.

Modifications are conceivable in the present example. When capacitive coupling between the P-type silicon layer 302a and the aluminium wire 316b at the intersection thereof is undesirable, the polycrystalline silicon layer 310r may be formed contiguously to the polycrystalline silicon layer 310m which in turn is connected to the grounding point of the circuit device. Then, the polycrystalline silicon layer 310r will serve as a shield electrode at the intersection between the P-type silicon layer 302a and the aluminium wire 316b.

In a similar manner, the P-type silicon layers and the polycrystalline silicon layers which are not intended to be used as signal lines may be connected to the aluminium layer through the grooves described above, while the aluminium layer is connected to the grounding point of the circuit device. With such arrangement, it is possible to suppress undesirable elctrical interferences amoung the elements and/or wirings.

We claim:
1. A method of fabricating a semiconductor integrated circuit device comprising the steps of:
(a) forming a first insulation film on a first semiconductor layer formed on an insulation substrate;
(b) removing selectively said first insulation film linearly along the profiles of first desired pattern regions in which circuit elements are to be formed in said first semiconductor layer through electron beam irradiation thereby to form a first linear aperture pattern in said first insulation film;
(c) etching selectively first semiconductor layer exposed in said first aperture pattern in said first insulation film thereby to form in said first semiconductor layer a groove which is located along said profiles of first desired pattern regions and penetrates said first semiconductor layer;
(d) oxidizing the wall of said groove so as to completely fill said groove with formed oxide of said semiconductor layer at substantially the same time thereby to form an isolating oxide region which isolates said first pattern regions of said first semiconductor layer from each other;
(e) removing said first insulation film and forming a second insulation film on said first semiconductor layer having said isolating oxide region;
(f) removing selectively said second insulation film through electron beam irradiation thereby to form at least one aperture for allowing impurity diffusion to at least one of said first pattern regions of said first semiconductor layer;
(g) forming a second semiconductor layer on said second insulation film;
(h) removing selectively said second semiconductor layer through electron beam irradiation along the profiles of second desired pattern regions in which wirings are to be formed in said second semiconductor layer thereby to form a second linear aperture pattern; and (i) diffusing impurity contained in the pattern regions of said second semiconductor layer selectively into at least one of the first pattern regions of said first semiconductor layer through said aperture formed in said second insulation film.

2. A method according to claim 1, further comprising:
(j) forming a third insulation film on said second semiconductor layer and forming a third aperture pattern in said third insulation film through electron beam irradiation for allowing electrode connection to be formed to at least one of the pattern regions of said first and second semiconductor layers;
(k) forming a metalized electrode region for allowing ohmic contacts to be made to at least one of the pattern regions of said first and second semiconductor layers through said third aperture pattern formed in said third insulation film; and
(l) dividing and electrically isolating said metalized electrode region through electron beam irradiation along the profile of a third desired pattern.

3. A method according to claim 2, wherein at least one first pattern region of said first semiconductor layer serves as an element region of an insulated gate field effect semiconductor element, and the source and drain regions of said insulated gate field effect semiconductor element are formed at said step (i) by diffusing impurity contained in said second pattern region of said second semiconductor layer overlying said first pattern region through the apertures of said second insulation film which are formed at said step (f).

4. A method of a semiconductor integrated circuit device comprising the steps of:
(a) forming a first electron beam resist film over a first silicon layer formed on an insulation substrate;
(b) scanning an electron beam over said first electron beam resist film along the profiles of first desired pattern regions which respectively define isolated regions to be formed in said first silicon layer thereby to effect electron beam exposure of portions of said first electron beam film corresponding to said profiles of the first desired pattern regions;
(c) removing said exposed portions of said first electron beam resist film thereby to form a first aperture pattern in said first electron beam resist film;
(d) removing selectively said first silicon layer by using said first electron beam resist film as a mask thereby to form in said first silicon layer first grooves which penetrate said first silicon layer and which are located with a width and along said profiles of the first desired pattern regions;
(e) oxidizing the walls of said first grooves so as to completely fill said first grooves with grown silicon oxide at substantially the same time thereby to form oxide regions which divide said first silicon layer into a plurality of isolated regions corresponding to said first desired pattern regions;
(f) forming a first insulation film over said first silicon layer having said oxide regions and said isolated regions;
(g) forming a second silicon layer on said first insulation film;
(h) forming a second electron beam resist film over said second silicon layer;
(i) scanning an electron beam over said second electron beam resist film along the profiles of second desired pattern regions which respectively define wiring regions to be formed in said second silicon layer thereby to effect electron beam exposure of portions of said second electron beam film corresponding to said profiles of the second desired pattern regions;
(j) removing said exposed portions of said second electron beam resist film thereby to form a second aperture pattern in said second electron beam resist film;
(k) removing selectively said second silicon layer by using said second electron beam resist film as a mask thereby to form in said second silicon layer second grooves which penetrate said second silicon layer and which are located with a width and along said profiles of the second desired pattern regions; and
(l) oxidizing the walls of said second grooves so as to completely fill said second grooves with grown silicon oxide at substantially the same time thereby to form oxide regions which divide said second silicon layer into a plurality of wiring regions corresponding to said second desired pattern regions.

5. A method according to claim 4, wherein at said step (f) another aperture pattern for contacting said isolated regions with said wiring regions is formed in said first insulating film.

6. A method according to claim 4, further comprising:
(m) forming a second insulation film on said second silicon layer and forming still another aperture pattern in said second insulation film through electron beam irradiation for allowing wirings to be formed to said first and second silicon layers;
(n) forming an aluminum layer for allowing ohmic contacts to be made to said first and second silicon layers through said aperture pattern formed in said second insulation film; and
(o) dividing and electrically isolating said aluminum layer into a plurality of wiring regions through electron beam irradiation along the profiles of said wiring regions to be formed in said aluminum layer.

* * * * *